(12) United States Patent
Yan (10) Patent No.: US 10,171,108 B1
(45) Date of Patent: Jan. 1, 2019

(54) PARALLEL CRC CALCULATION FOR MULTIPLE PACKETS WITHOUT REQUIRING A SHIFTER

(71) Applicant: Altera Corporation, San Jose, CA (US)

(72) Inventor: Junjie Yan, St. Johns's (CA)

(73) Assignee: ALTERA CORPORATION, San Jose, CA (US)

( * ) Notice: Subject to any disclaimer, the term of this patent is extended or adjusted under 35 U.S.C. 154(b) by 36 days.

(21) Appl. No.: 15/016,672

(22) Filed: Feb. 5, 2016

Related U.S. Application Data (60) Provisional application No. 62/272,501, filed on Dec. 29, 2015.

(51) Int. Cl.
  *H03M 13/09* (2006.01)
  *H04L 29/08* (2006.01)
  *H03M 13/00* (2006.01)
  *H04L 1/00* (2006.01)

(52) U.S. Cl.
  CPC ....... *H03M 13/091* (2013.01); *H03M 13/616* (2013.01); *H04L 1/0061* (2013.01); *H04L 69/324* (2013.01)

(58) Field of Classification Search
  CPC . H03M 13/091; H03M 13/616; H04L 1/0061; H04L 69/324
  See application file for complete search history.

(56) References Cited

U.S. PATENT DOCUMENTS

| | | | |
|---|---|---|---|
| 7,360,142 B1* | 4/2008 | Barash | |
| 2007/0076680 A1* | 4/2007 | Amram | H04L 1/0083 370/349 |
| 2015/0280741 A1* | 10/2015 | Bryant | H03M 13/093 714/807 |
| 2016/0337083 A1* | 11/2016 | Englert | H04L 1/0061 |

OTHER PUBLICATIONS

Ali et al., "Packet Oriented Error Correcting Codes Using Vandermonde Matrices and Shift Operators", Wireless Communications and Networking Conference, 2008. WCNC 2008. IEEE,Mar. 31, 2008 (Year: 2008).*

* cited by examiner

*Primary Examiner* — April Y Blair
*Assistant Examiner* — Rong Tang
(74) *Attorney, Agent, or Firm* — Fletcher Yoder PC (57) ABSTRACT

Systems and methods are provided herein for removing the need to account for varying lengths of data packets that are transmitted during a single clock cycle, and to require only one CRC calculation block for handling parallel processing of a stream of data packets received during a clock cycle. Moreover, systems and methods are provided herein for eliminating a need for a shifter, such as a barrel shifter, to process the data packets of a single clock cycle in parallel.

20 Claims, 6 Drawing Sheets

PARALLEL CRC CALCULATION FOR MULTIPLE PACKETS WITHOUT REQUIRING A SHIFTER

CROSS-REFERENCE TO RELATED APPLICATIONS

This patent application claims the benefit of U.S. Provisional Patent Application No. 62/272,501, filed Dec. 29, 2015, the disclosure of which is hereby incorporated by reference herein in its entirety.

BACKGROUND OF THE INVENTION

Typically, when multiple packets are processed in the same clock cycle, either a frame check sequence ("FCS") or a cyclic redundancy cycle ("CRC") needs to be generated for each packet in that clock cycle. Separate FCS and CRC generators must be installed for each packet that is to be parallel-processed. The FCS and CRC generators must also account for varying lengths of each individual packet when the lengths of these packets vary, which is common in scenarios where a data path has a wide bandwidth that accommodates many packets in a single clock cycle. Accounting for the varying lengths of the packets, and using many FCS or CRC blocks for parallel processing, requires a large amount of computational resources and chip space.

SUMMARY

Systems and methods are provided herein for removing the need to account for varying lengths of data packets that are transmitted during a single clock cycle, and to require only one CRC calculation block for handling parallel processing of a stream of data packets received during a clock cycle. Moreover, systems and methods are provided herein for eliminating a need for a shifter, such as a barrel shifter, to process the data packets of a single clock cycle in parallel.

In order to obviate the need for any of alignment circuitry, multiple CRC calculation blocks, and shifters in calculating CRC values for multiple data packets of varying lengths in parallel, a single N-byte CRC calculation block may be used instead of N sub-blocks to handle data streams of up to a length of N. In sum, when a data stream is received, the number of packets (N) of the data stream may be tallied, and a separate copy of the entire data stream may be generated for each packet of the data stream, resulting in N copies of the data stream. Then, beginning with the first copy of the data stream, all data packets other than the first, left-most data packet may be replaced by padding bits (e.g., zeros or ones). In the second copy of the data streams, all packets other than the second left-most data packet may be replaced by padding bits. This process continues for all N packets, thus resulting in a matrix of data streams where all values other than one in any given row are padding bits, where each row contains a unique packet. The matrix's top-left to bottom-right diagonal will thus contain the packets of the data stream, and all other entries of the matrix are padding bits.

The matrix of packets may then be sent to a single CRC block, which will calculate a CRC value for each row of the matrix in parallel, without use of any alignment circuitry, and without the need for individual CRC blocks for each data packet to accommodate parallel processing. Subsequent to calculating the CRC values, the original data stream may be recovered using matrix reverse blocks to remove the padding bits. The CRC values may be appended to the individual data packets in the data stream during the recovery process.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

Systems and methods are described herein for parallel calculation of CRC values for all data packets of a data stream of a clock cycle. In particular, the systems and methods described herein eliminate a need for a barrel shifter, or any other type of shifter, to effect the parallel calculation. Also eliminated is a need for alignment circuitry, or individual CRC blocks for each data packet.

Figure 1:
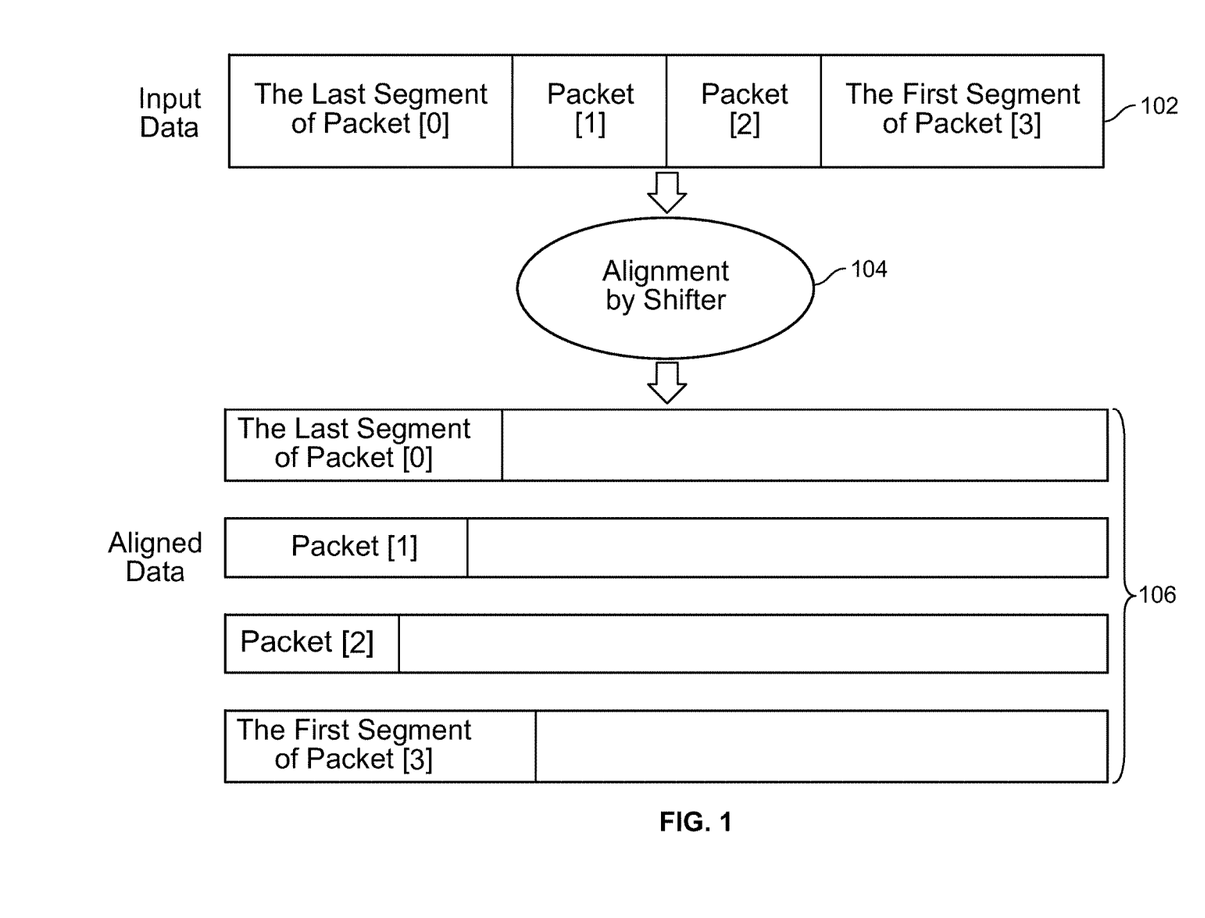
FIG. 1 depicts a block diagram of input data and alignment data for calculating CRC values for each packet of a data stream by using a barrel shifter to align the data packets of the data stream, in accordance with some embodiments of the disclosure.

FIG. 1 depicts a block diagram of input data and alignment data for calculating CRC values for each packet of a data stream by using a barrel shifter to align the data packets of the data stream, in accordance with some embodiments of the disclosure. In FIG. 1, input data 102 is received during a clock cycle. Input data 102 may, for example, contain a last segment of packet [0], all of packet [1], all of packet [2], and a first segment of packet [3]. As an example, the first segment of packet [0] may have been received during a previous clock cycle, and the last segment of packet [3] may be transmitted in a future clock cycle.

In order to, in parallel, calculate a CRC value for each of the last segment of packet [0], all of packet [1], all of packet [2], and the first segment of packet [3], function 104 is depicted, where each of the data packets of input data 102 are aligned by way of a shifter (e.g., a barrel shifter). Block 106 depicts the aligned data. The manner in which the parallel processing is performed on aligned data 106 is depicted in FIG. 2.

Figure 2:
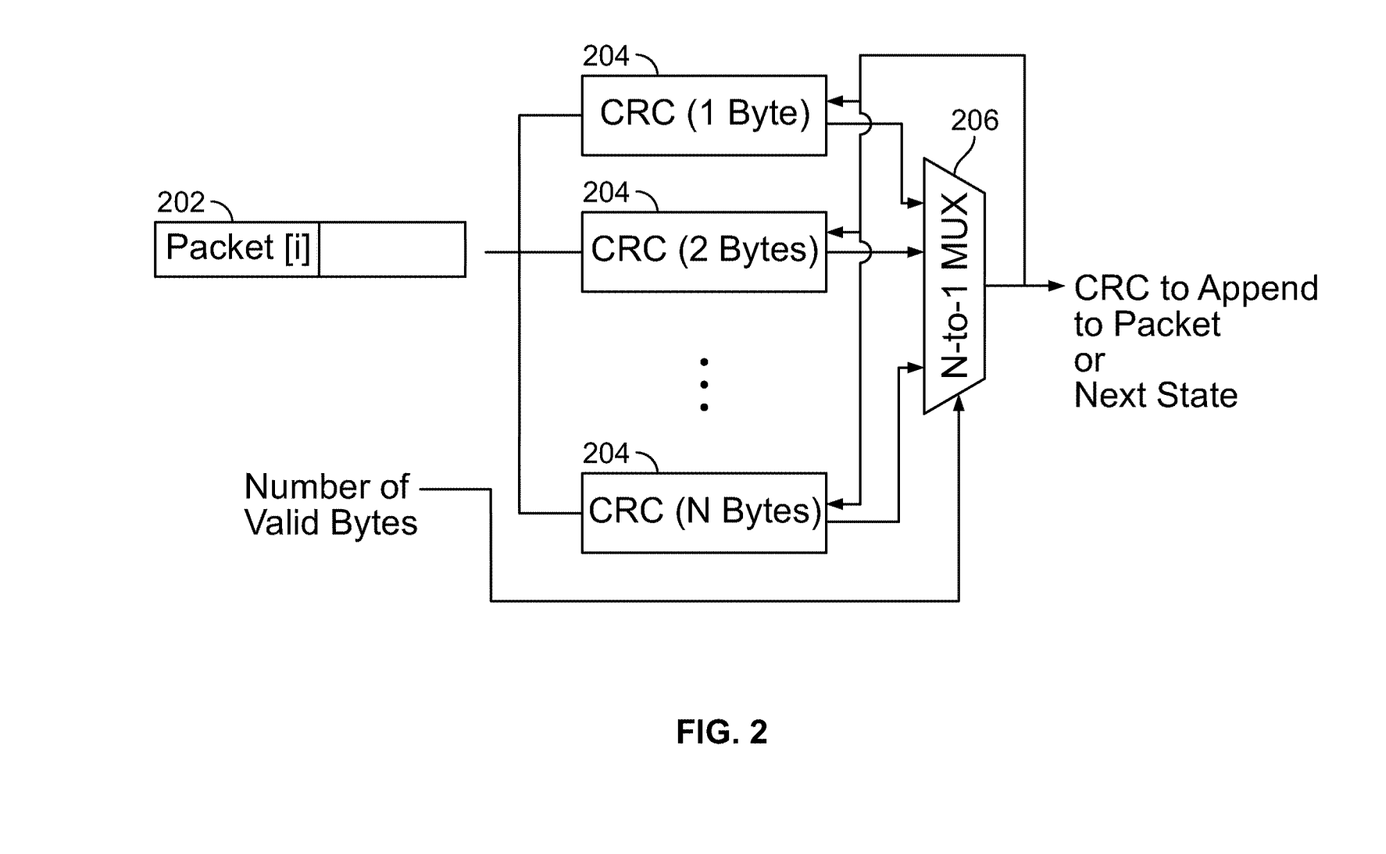
FIG. 2 depicts a block diagram of how a given packet of a data stream may have a CRC value calculated for it, in accordance with some embodiments of the disclosure.

FIG. 2 depicts a block diagram of how a given packet of a data stream may have a CRC value calculated for it, in accordance with some embodiments of the disclosure. In FIG. 2, aligned packet 202 may be any of the aligned data 106. Aligned packet 202 may be fed through any of CRC calculation blocks 204. CRC calculation blocks 204 may be identical. The output of CRC calculation blocks 204 may be transmitted to multiplexor 206, along with a number of valid bytes. Multiplexor 206 may either move to a next state, where more aligned data is to be processed in parallel through the CRC calculation blocks 204, or, if calculations are complete, CRC values may be appended to data packets (e.g., aligned packet 202), and the data packets may be output after being multiplexed back together.

Some aspects of the disclosure intend to remove inefficiencies of the above-described embodiments. Namely, barrel shifters, and other types of shifters, as well as separate, identical CRC blocks, use a significant amount of chip space. These components are expensive to implement in programmable logic devices ("PLDs"), such as field programmable gate arrays ("FPGAs"). To this end, the preferred embodiment of the disclosure does not use the alignment circuitry described with respect to FIG. 1 and FIG. 2.

Figure 3:
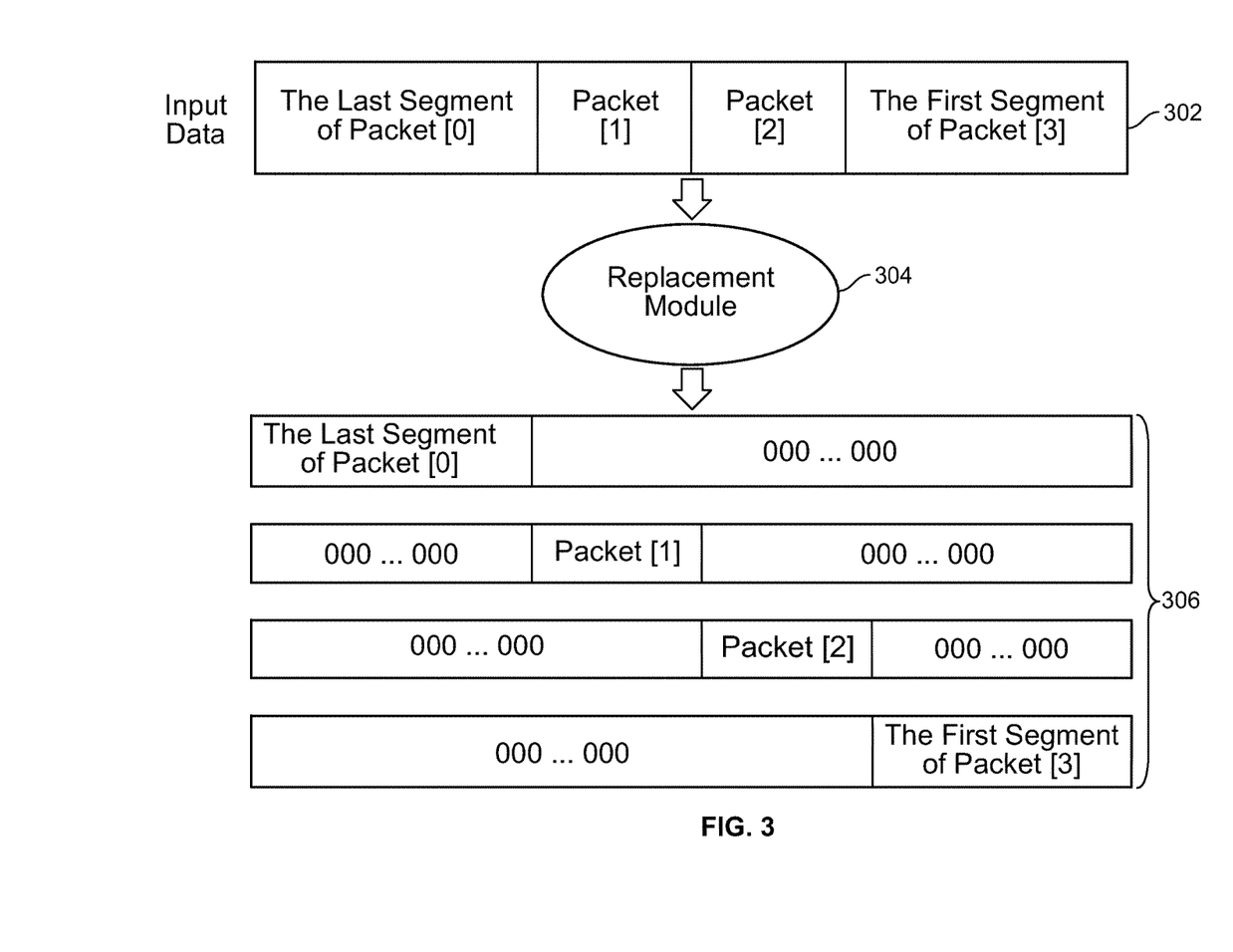
FIG. 3 depicts a block diagram of input data, padding bit replacement, and a resultant matrix, for calculating CRC values of a data stream, in accordance with some embodiments of the disclosure.

FIG. 3 depicts a block diagram of input data, a padding bit replacement block, and a resultant matrix, for calculating CRC values of a data stream, in accordance with some embodiments of the disclosure. Depicted in FIG. 3 is input data 302. Input data 302 is a data stream received in a single clock cycle. While the disclosure consistently describes input data 302 as data received in a single clock cycle, any number of clock cycles may be used to populate input data 302.

After input data 302 is received, processing circuitry may process input data 302 with replacement block 304. Replacement block 304 may be a software module or subroutine. When replacement block 304 is executed, input data 302 is replicated as many times as there are data packets in input data 302. For example, input data 302 has four data packets, and thus, replacement block 304 replicates input data 302 four times, thus resulting in a four by four matrix, with four rows of replicated copies, and four columns of data packets. Note that four data packets are used as an illustrative example, and input data 302 may include any number of data packets.

Following replication, replacement module 304 may set a counter i to zero. Replacement module 304 may then go through each row i+1 of the matrix, and replace each data packet of the respective row other than the ith data packet with padding bits (e.g., either zeros or ones). Replacement module 304 may increment the counter each time a replacement is performed and a new row is assessed. Thus, working from the example of FIG. 3, for the first row, the ith packet is packet [0]. Replacement module 304 may replace all packets other than packet [0] with padding bits. As depicted in FIG. 3, packets [1], [2], and [3] are replaced with zeros. The counter is then incremented by one, and thus set to a value of one, and the process then iterates through the second row. Thus, all packets other than packet [1] are replaced by padding bits (zeros, as illustrated). This process iterates through each row, and the result is depicted in matrix 306. Note that the effective result of replacement module 306 is that all packets other than those on the diagonal of matrix 306 are replaced by padding bits. The utility of matrix 306 is further described with respect to FIG. 4.

Figure 4:
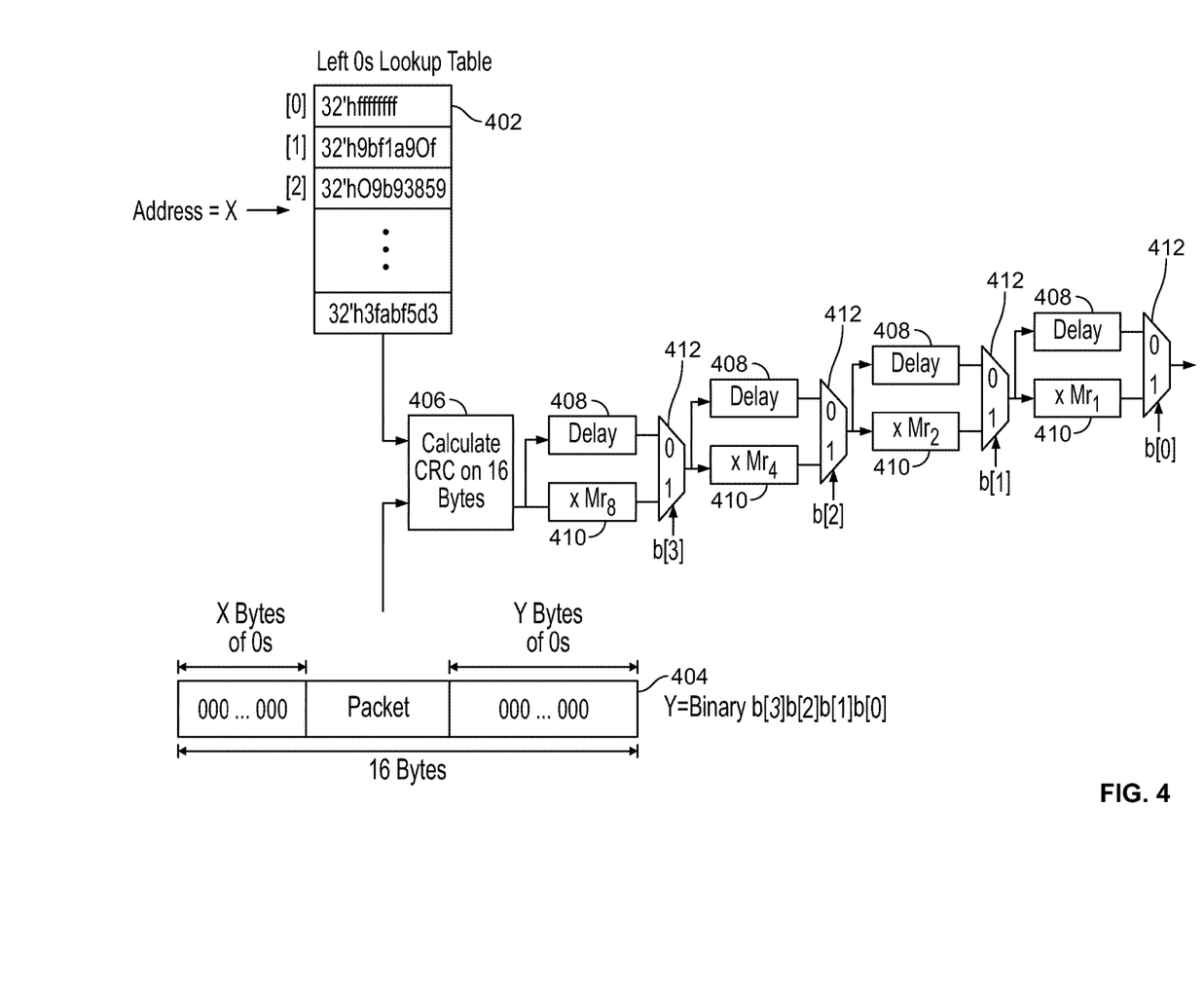
FIG. 4 depicts a block diagram including inputs and circuitry for calculating CRC values of a data stream, in accordance with some embodiments of the disclosure.

FIG. 4 depicts a block diagram including inputs and circuitry for calculating CRC values of a data stream, in accordance with some embodiments of the disclosure. FIG. 4 depicts lookup table 402, which contains N values (i.e., the same number of values as there are data packets in data stream 302). The values in lookup table 402 may be pre-calculated by software (e.g., replacement module 304), as well as by using an initial state. An example of an initial state is 32'hffff_ffff for Ethernet packets. The calculated values may be stored in read-only memory ("ROM").

For example, lookup table 402 is the result generated by software based on polynomial G(x)=×32+x26+x23+x22+x16+x12+x11+x10+x8+x7+x5+x4+x2+x1+1, where x32 corresponds to the most significant bit and x0 corresponds to the least significant bit. The 32-bit FCS is represented by FCS32. If the initial value is 32'hffff_ffff, which can be considered as the remainder of data X operated on G(x), the value of X does not matter:

FCS32=(data X, packet data) Mod G(x) XOR 32'hffffffff (data X) Mod G(x)=32'hffffffff With reference to lookup table 402, the value in address 0 is 32'hffffffff, which indicates that the first byte of packet A starts from the first byte in the data path, and that there are no padding bits before packet A. The value in address 1 is 32'h9bf1a90f, which indicates that the first byte of packet B in input data 302 starts from the second byte in the data path and the first byte in the data path is replaced by 8'h00. Therefore, for packet B:

(data X) Mod G(x)=32'h9bf1a90f (data X, 8'h00) Mod G(x)=32'hffffffff

FCS32=(data X, 8'h00, packet B) Mod G(x) XOR 32'hffffffff

Data input copy 404 is one row of matrix 306. While the entirety of matrix 306 may be fed into CRC calculation block 406, only one row is depicted for convenience. Data input copy 404 has X bytes of leading zeros, and Y bytes of tail zeros. Y may be calculated by using the following formula: Y=Binary b[3]b[2]b[1]b[0], which is a binary expression for decimal value Y, as is illustrated in table 1 as follows.

TABLE 1

| Binary Expression for Decimal Value Y | | | | |
|---|---|---|---|---|
| Y | b[3] | b[2] | b[1] | b[0] |
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| ... | | | ... | |
| 15 | 1 | 1 | 1 | 1 |

The total length of data input copy 404 (and of matrix 306) is, in this example, 16 bytes. CRC calculation block 406 is capable of processing a length of up to 16 bytes at one time. Thus, CRC calculation block 406 is able to process each row of matrix 306 in parallel, regardless of the length of any individual packet of input data 302.

Following CRC calculation for each data packet of matrix 306 by way of CRC calculation block 406, the original data packet 302 is to be reconstructed. To reconstruct data packet 302 from matrix 306, matrix reverse blocks 410 are used. One matrix reverse block 410 is required for each row of matrix 306. Delay blocks 408 have delay equal to the latency caused by matrix reverse blocks 410. As depicted in matrix reverse blocks 410, x is the CRC value, and $Mr_b$ is a constant matrix value of b bytes. Multiplexers 412 are used to remove the bit padding after each matrix reverse block is processed. The end result is the original input data 302, with CRC values for each packet appended to the original input data 302.

In order to scale the system depicted in FIG. 4, the cost would merely be adding matrix reverse blocks and additional ROM. Thus, it is inexpensive to scale the aspects of the preferred embodiment of the disclosure. Moreover, the hardware space required on a programmable integrated circuit device, such as an FPGA, to accommodate ROM and reverse blocks is very small as compared to that required for shifters (e.g., barrel shifters) and alignment circuitry. Because the preferred embodiment only has one CRC calculation block that operates on N bytes every time for each packet, there is no need for a front-shifter to align input data, nor for an end-shifter to select from N calculations.

Figure 5:
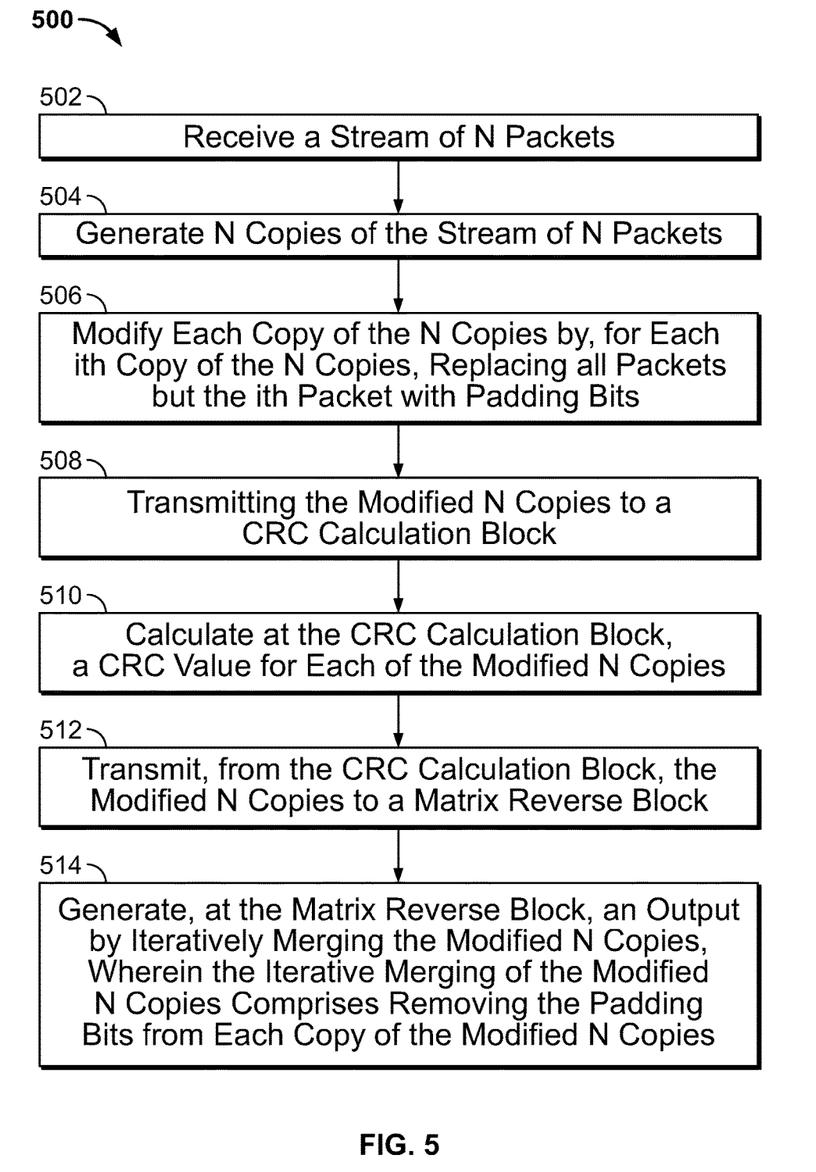
FIG. 5 is a flow chart that depicts a process for parallel calculation of CRC values of packets of a data stream, in accordance with some embodiments of this disclosure.

FIG. 5 is a flow chart that depicts a process for parallel calculation of CRC values of packets of a data stream, in accordance with some embodiments of this disclosure. Process 500 begins at 502, where processing circuitry may receive a stream of N packets. This stream may include, or be limited to, packets received during a single clock cycle, or during a discrete number of clock cycles. Process 500 continues to 504, where the processing circuitry may generate N copies of the stream of N packets. For example, if four packets are received in the stream, four copies may be made. As described above and below, this may result in a four by four matrix of data streams. Process 500 may continue to 506, where processing circuitry may modify each copy of the N copies by, for each ith copy of the N copies, replacing all packets but the ith packet with padding bits. As described above and below, this process may alternatively be described as replacing all data other than the top-left to bottom-right diagonal of the matrix with padding bits.

Process 500 may continue to 508, where the processing circuitry may cause the modified N copies to be transmitted to a CRC calculation block. As described above and below, the single CRC calculation block may process the entire matrix at once, thus resulting in parallel CRC calculation for each packet of the data stream. At 510, the CRC calculation block may calculate a CRC value for each of the modified N copies.

At 512, the CRC calculation block may transmit the modified N copies to a matrix reverse block. As described above and below, the matrix reverse block may be used to reform the original data stream, and may append the calculated CRC values to the original data stream. For example, at 514, an output may be generated at the matrix reverse block by iteratively merging the modified N copies, where the iterative merging of the modified N copies includes removing the padding bits from each copy of the modified N copies. Through this process, the original data stream may be recovered from the matrix by way of the matrix reverse block.

It is contemplated that the steps or descriptions of FIG. 5 may be used with any other embodiment of this disclosure. In addition, the steps and descriptions described in relation to FIG. 5 may be done in alternative orders or in parallel to further the purposes of this disclosure. For example, each of these steps may be performed in any order or in parallel or substantially simultaneously to reduce lag or increase the speed of the system or method. Furthermore, it should be noted that any of the devices or equipment discussed in relation to FIGS. 1-4 could be used to perform one or more of the steps in FIG. 5.

Figure 6:
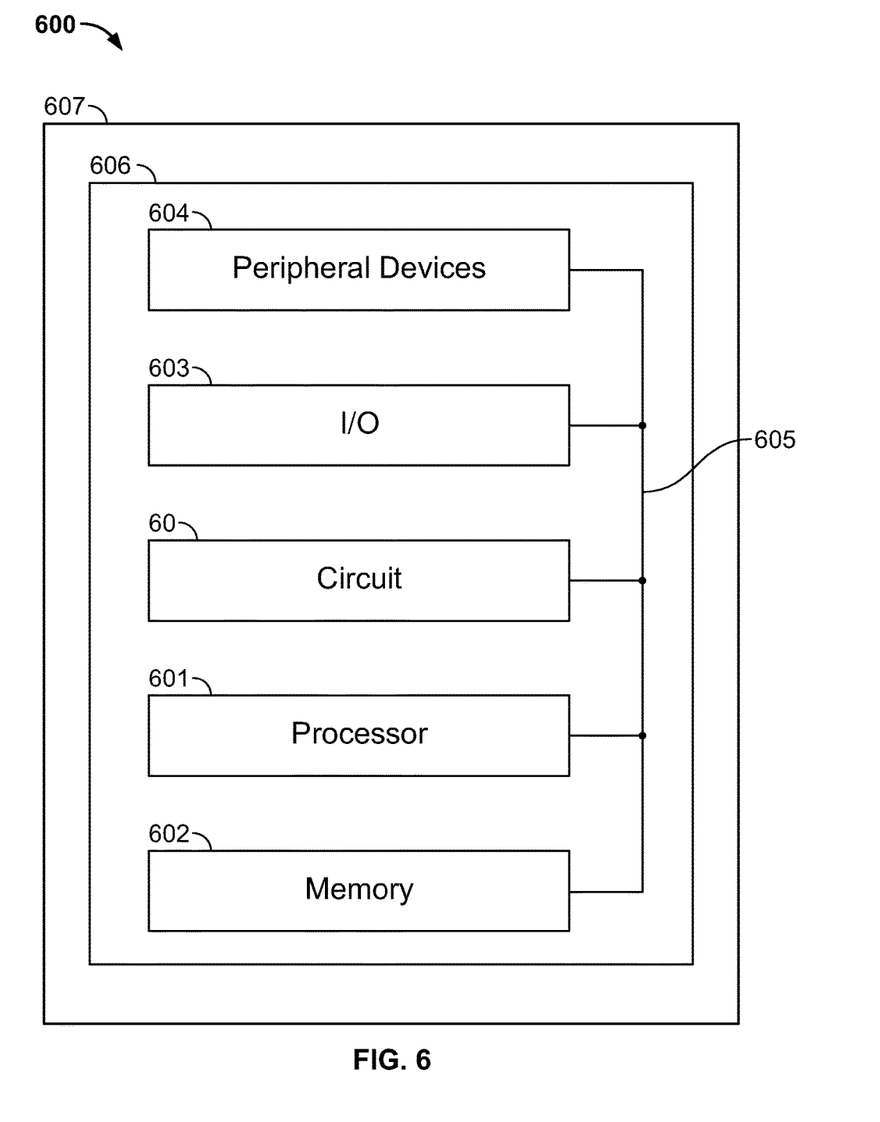
FIG. 6 is a simplified block diagram of an exemplary system employing a programmable logic device incorporating systems and methods of the present disclosure, in accordance with some embodiments of this disclosure.

As depicted in FIG. 6, an Integrated Circuit Programmable Logic Device (PLD) 600 incorporating the CRC calculation schemes according to the present disclosure may be used in many kinds of electronic devices. Integrated Circuit Programmable Logic Device 600 may be an integrated circuit, a processing block, application specific standard product (ASSP), application specific integrated circuit (ASIC), programmable logic device (PLD) such as a field programmable gate array (FPGA), full-custom chip, or a dedicated chip, however, for simplicity, it may be referred to as PLD 600 herein. One possible use is in an exemplary data processing system 600 shown in FIG. 6. Data processing system 600 may include one or more of the following components: a processor 601; memory 602; I/O circuitry 603; and peripheral devices 604. These components are coupled together by a system bus 605 and are populated on a circuit board 606 which is contained in an end-user system 607.

System 600 can be used in a wide variety of applications, such as computer networking, data networking, instrumentation, video processing, digital signal processing, or any other application where the advantage of using programmable or reprogrammable logic is desirable. PLD 600 can be used to perform a plurality of different logic functions. For example, PLD 600 can be configured as a processor or controller that works in cooperation with processor 601. PLD 600 may also be used as an arbiter for arbitrating access to a shared resource in system 600. In yet another example, PLD 600 can be configured as an interface between processor 601 and one of the other components in system 600. It should be noted that system 600 is only exemplary, and that the true scope and spirit of the invention should be indicated by the following claims.

Various technologies can be used to implement PLDs 600 as described above and incorporating this disclosure.

No admission is made that any portion of the disclosure, whether in the background or otherwise, forms a part of the prior art. The processes discussed above are intended to be illustrative and not limiting. One skilled in the art would appreciate that the steps of the processes discussed herein may be omitted, modified, combined, and/or rearranged, and any additional steps may be performed without departing from the scope of the invention. More generally, the above disclosure is meant to be exemplary and not limiting. Only the claims that follow are meant to set bounds as to what the present disclosure includes. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time. It should also be noted, the systems and/or methods described above may be applied to, or used in accordance with, other systems and/or methods.

What is claimed is:

1. A programmable integrated circuit device for parallel calculation of cyclic redundancy check ("CRC") values for a plurality of packets received in a clock cycle, the programmable integrated circuit device comprising:
   a padding bit-replacement block configured to:
      receive a stream comprising the plurality of packets, wherein the plurality of packets have N packets;
      generate N copies of the stream, wherein each copy of the stream is associated with a respective packet of the plurality of packets; and
      for each respective copy of the N copies of the stream, replace with padding bits all packets but the respective packet associated with the respective copy to create a respective padded copy of a plurality of padded copies;
   a CRC calculation block configured to:
      receive the plurality of padded copies; and
      calculate a packet CRC value for each packet of the plurality of packets to form a plurality of packet CRC values by calculating a respective CRC value for each respective padded copy of the plurality of padded copies; and a matrix reverse block configured to iteratively merge each padded copy of the plurality of padded copies by removing the padding bits from each padded copy of the plurality of padded copies to produce a reformed stream.

2. The programmable integrated circuit device of claim 1, wherein the matrix reverse block is configured to append each respective packet CRC value to the respective packet of the reformed stream.

3. The programmable integrated circuit device of claim 1, wherein the matrix reverse block is configured to perform N matrix reverse operations.

4. The programmable integrated circuit device of claim 1, wherein the CRC calculation block is configured to calculate each respective packet CRC value by using a lookup table to determine values of padding bits to the left of the respective packet in the respective padded copy.

5. The programmable integrated circuit device of claim 1, wherein the CRC calculation block is configured to calculate plurality of packet CRC values from the plurality of padded copies in parallel.

6. The programmable integrated circuit device of claim 1, wherein the padding bits are all either zeros or ones for all padded copies of the plurality of padded copies.

7. The programmable integrated circuit device of claim 1, wherein the stream is received during one single clock cycle.

8. A method for parallel calculation of cyclic redundancy check ("CRC") values for a plurality of packets received in a clock cycle, the method comprising:

receiving a stream comprising a first number of packets in replicating and padding circuitry;

generating a plurality of copies of the stream, wherein each copy of the stream of copies is associated with a packet of the stream;

modifying each copy of the plurality of copies to generate a modified copy of a plurality of modified copies by, for each respective copy of the plurality of copies, replacing all packets of the respective copy of the stream but the respective associated packet with padding bits to generate a respective modified copy;

transmitting the plurality of modified copies to a CRC calculation block;

calculating, at the CRC calculation block, a respective CRC value associated with each packet of the stream by performing a CRC operation for each respective modified copy of the plurality of modified copies;

transmitting, from the CRC calculation block, the plurality of modified copies to a matrix reverse block; and generating, at the matrix reverse block, restored data stream by iteratively merging the plurality of modified copies, wherein the iterative merging of the plurality modified copies comprises removing the padding bits from each modified copy of the plurality of modified copies.

9. The method of claim 8, comprising appending to each respective packet the respective calculated CRC value at the matrix reverse block.

10. The method of claim 8, wherein iteratively merging the plurality of modified copies comprises performing matrix reverse operations.

11. The method of claim 8, comprising calculating, at the CRC calculation block, each respective CRC value by using a lookup table to determine values of padding bits to the left of the respective packet in the respective modified copy.

12. The method of claim 8, comprising calculating, at the CRC calculation block, each respective CRC value for each respective modified copy of the plurality of modified copies in parallel.

13. The method of claim 8, wherein the padding bits are all either zeros or ones.

14. The method of claim 8, wherein the plurality of packets comprise data packets or data packet segments or both received during one single clock cycle.

15. A non-transitory machine-readable medium comprising memory with instructions configured to cause data processing circuitry to perform parallel calculation of cyclic redundancy check ("CRC") values for a plurality of packets received in a clock cycle, wherein the instructions cause the data processing circuitry to:

receive a stream having a first number of packets at a padding bit-replacement block of the data processing circuitry;

generate, at the padding bit-replacement block, a plurality of copies of the stream having the first number of copies, wherein each respective copy is associated with one corresponding packet of the stream;

modify, at the padding bit-replacement block, each respective copy of the plurality of copies to form a plurality of modified copies by replacing all packets but the respective packet associated with the respective copy with padding bits to generate a respective modified copy associated with the respective packet;

transmit the plurality of modified copies to a CRC calculation block of the data processing circuitry;

calculate, at the CRC calculation block, a respective CRC value for each respective packet by calculating the CRC of the respective modified copy associated with the respective packet;

transmit, from the CRC calculation block, the plurality of modified copies to a matrix reverse block of the data processing circuitry; and generate, at the matrix reverse block, a reformed data stream by iteratively merging each modified copy of the plurality of modified copies by removing the padding bits from each modified copy of the plurality of modified copies.

16. The non-transitory machine-readable medium of claim 15, comprising instructions configured to cause the matrix reverse block to append to the reformed data stream each calculated CRC value.

17. The non-transitory machine-readable medium of claim 15, wherein the matrix reverse block comprises matrix reverse operations performed a number of times equal to the first number.

18. The non-transitory machine-readable medium of claim 15, comprising instructions configured to cause the CRC calculation block to calculate each respective CRC value by using a lookup table to determine values of padding bits to the left of the respective packet in the respective associated modified copy.

19. The non-transitory machine-readable medium of claim 15, comprising instructions configured to cause the CRC calculation block to calculate the respective CRC values in parallel.

20. The non-transitory machine-readable medium of claim 15 wherein the stream comprises data packets or data packet segments or both received during one single clock cycle.

\* \* \* \* \*